United States Patent [19]
Fulford, Jr. et al.

[11] Patent Number: 6,030,752
[45] Date of Patent: Feb. 29, 2000

[54] METHOD OF STITCHING SEGMENTS DEFINED BY ADJACENT IMAGE PATTERNS DURING THE MANUFACTURE OF A SEMICONDUCTOR DEVICE

[75] Inventors: H. Jim Fulford, Jr.; Robert Dawson, both of Austin; Mark I. Gardner, Cedar Creek; Frederick N. Hause, Austin; Mark W. Michael, Cedar Park; Bradley T. Moore; Derick J. Wristers, both of Austin, all of Tex.

[73] Assignee: Advanced Micro Devices, Inc.

[21] Appl. No.: 08/805,534

[22] Filed: Feb. 25, 1997

[51] Int. Cl.[7] .................................................. G03F 7/20
[52] U.S. Cl. .......................... 430/312; 430/394; 430/396
[58] Field of Search .................................... 430/312, 313, 430/314, 296, 394, 396; 250/492.2, 492.22

[56] References Cited

U.S. PATENT DOCUMENTS

| | | | |
|---|---|---|---|
| 4,345,366 | 8/1982 | Brower | 29/571 |
| 4,440,493 | 4/1984 | Hiraga | 355/86 |
| 4,847,213 | 7/1989 | Pfiester | 437/24 |
| 5,169,796 | 12/1992 | Murray et al. | 437/41 |
| 5,364,718 | 11/1994 | Oae et al. | 430/5 |
| 5,397,715 | 3/1995 | Miller | 437/27 |
| 5,437,946 | 8/1995 | McCoy | 430/5 |
| 5,455,444 | 10/1995 | Hsue | 257/413 |
| 5,532,114 | 7/1996 | Bae | 430/312 |
| 5,731,131 | 3/1998 | Momma et al. | 430/311 |
| 5,792,591 | 8/1998 | Theuwissen | 430/312 |

FOREIGN PATENT DOCUMENTS 62-35667  2/1987  Japan .

OTHER PUBLICATIONS

M. Ono et al., "A 40 nm Gate Length n–MOSFET," IEEE Transactions on Electron Devices, vol. 42, No. 10, (1995), pp. 1822–1830.

*Primary Examiner*—Sharon Gibson
*Assistant Examiner*—Jill N. Holloman
*Attorney, Agent, or Firm*—Skjerven, Morrill, MacPherson, Franklin & Friel, L.L.P.; William W. Holloway

[57] ABSTRACT

A method of stitching segments defined by adjacent image patterns of a photolithographic system during the manufacture of a semiconductor device is disclosed. The method includes forming a material over a semiconductor substrate, projecting a first image pattern over the substrate that defines a first segment and a contact region, projecting a second image pattern over the substrate that defines a second segment with an end that overlaps the contact region, and removing a portion of the material corresponding to the first and second image patterns to form the first and second segments stitched by a portion of the contact region. The contact region has a greater width than the first and second segments. In this manner, the contact region accommodates misalignments that might otherwise lead to inadequate coupling or decoupling between the first and second segments. The invention is particularly well-suited for stitching polysilicon gates of N-channel and P-channel devices.

28 Claims, 11 Drawing Sheets

METHOD OF STITCHING SEGMENTS DEFINED BY ADJACENT IMAGE PATTERNS DURING THE MANUFACTURE OF A SEMICONDUCTOR DEVICE

BACKGROUND OF THE INVENTION

1. Field of the Invention

The present invention relates to integrated circuit manufacturing, and more particularly to a method of stitching segments defined by adjacent image patterns of a photolithographic system during the manufacture of a semiconductor device.

2. Description of Related Art

Photolithography is frequently used in semiconductor fabrication to selectively expose regions of a material on a semiconductor wafer or substrate. Typically, the wafer is cleaned and prebaked to drive off moisture and promote adhesion, an adhesion promoter is deposited on the wafer, a few milliliters of photoresist are deposited onto the spinning wafer to provide a uniform layer, the wafer is soft baked to drive off remaining solvents, the wafer is put into a photolithographic system and exposed to radiation of an appropriate wavelength that transfers a master pattern from a reticle, and then the photoresist is developed. Positive photoresist, in which the developer removes the irradiated regions, is usually used. The photoresist is further hard baked to improve its etch resistance, and then the wafer is subjected to an additive process (such as ion implantation) or a subtractive process (such as etching) using the photoresist as a mask. Thereafter, the photoresist is stripped.

Photolithographic systems typically use an optical radiation source and a lens in conjunction with a mask or reticle to selectively irradiate the photoresist. The radiation source projects radiation through the mask or reticle to the lens, and the lens focuses an image of the mask or reticle onto the wafer. A mask transfers a pattern onto the entire wafer (or another mask) in a single exposure step or scanned exposure, whereas a reticle transfers a pattern onto only a portion of the wafer.

The three major methods of optically transferring a pattern on a mask or reticle to a photoresist-coated wafer include contact printing, proximity printing, and projection printing. In contact printing, the mask is clamped against a photoresist-coated wafer. Although this optimizes image transfer and resolution, the contacting process results in mask defects. In proximity printing, the mask and photoresist are spaced by a small distance. Although this overcomes the defect problems associated with contact printing, it also requires extremely flat wafers and masks. In projection printing, lens elements or mirrors are used to focus the mask or reticle image on the photoresist, which is spaced from the mask or reticle by a large distance. Projection printing is usually used for photolithographic pattern transfer in semiconductor fabrication and many technologies have been developed, including projection scanners and step and repeat systems. Projection scanners use a reflective parabolic mirror to project the mask onto the wafer by scanning the wafer and the mask with a narrow arc of radiation. Step and repeat systems (steppers) project an image only onto a portion of the wafer. Multiple images of the reticle pattern are stepped and repeated over the entire wafer using multiple exposures. The reticle pattern is typically 1X to 10X the size of the image pattern on the wafer, with reduction provided by the lens. Non-reduction (1X) steppers offer a larger field, thereby allowing more than one pattern to be printed at each exposure. In this manner, a single reticle can be used to create a very large pattern containing a repeated image pattern.

In some instances, it is desirable to provide continuous lines that span several exposure fields. However, it has been found difficult to precisely match up the edge of a previously exposed image pattern with the edge of the image pattern adjacent to the previously exposed image pattern. FIGS. 1A–1D show a conventional approach for correcting misalignment between segments defined by adjacent image patterns. In FIG. 1A, segments 100 and 102 are laterally displaced in the x-direction and are decoupled from one another. In FIG. 1B, segments 110 and 112 are laterally displaced in the y-direction but remain coupled to one another by a thin region. In FIG. 1C, segments 120 and 122 are laterally displaced in the y-direction and are decoupled from one another, and in FIG. 1D segments 130 and 132 are laterally displaced in both the x- and y-directions and are decoupled from one another. For electrically conductive segments, such as polysilicon and metallization such as aluminum, that are intended to form a continuous circuit, a discontinuity between the segments constitutes an open circuit. Furthermore, when conductive segments are coupled by a significantly smaller region than the linewidths (FIG. 1B), the coupling may be inadequate since the line resistance may become too high, and metal segments (particularly aluminum) become more susceptible to decoupling due to electromigration. In FIGS. 1A–1D, the segments are stitched using a conventional approach by depositing metal contacts 104, 114, 124 and 134, respectively (shown as broken lines) over the ends of the segments. A disadvantage to this approach, however, is that additional processing steps are required to deposit and etch the metal contacts.

Accordingly, a need exists for an improved method of stitching together segments defined by adjacent image patterns projected onto a photoresist layer so that segments are adequately coupled to one another.

SUMMARY OF THE INVENTION

The invention addresses the aforementioned need by providing an improved method of stitching segments defined by adjacent image patterns of a photolithographic system during the manufacture of a semiconductor device. A key feature of the invention is a wide contact region adjacent to one of the segments.

In accordance with one aspect of the invention, the method includes forming a material over a semiconductor substrate, projecting a first image pattern over the substrate that defines a first segment and a contact region, projecting a second image pattern over the substrate that defines a second segment with an end that overlaps the contact region, and removing a portion of the material corresponding to the first and second image patterns to form the first and second segments stitched by a portion of the contact region. The contact region is wider than the first and second segments. As a result, the contact region accommodates misalignments that might otherwise lead to inadequate coupling or decoupling between the first and second segments.

The first and second image patterns partially overlap so that at least a portion of the second segment overlaps the contact region. For instance, the first image pattern has a first outer border, the first segment is spaced from the first outer border, and the contact region is between and adjacent to the first segment and the first outer border. The second image pattern has a second outer border, and an end of the second segment is adjacent to the second outer border. The first and second borders are parallel to and spaced from one another, and the first and second image patterns partially overlap between the first and second outer borders.

The first image pattern can be projected before or after the second image pattern. Furthermore, the first and second segments can be formed simultaneously or in sequence. For instance, the first and second segments can be formed simultaneously by projecting the first and second image patterns onto a single photoresist layer using separate exposure steps, developing the photoresist layer, and etching the material to form the first and second segments. Alternatively, the first and second segments can be formed in sequence by projecting the first image pattern onto a first photoresist layer, developing the first photoresist layer, etching the material to form the first segment, and then projecting the second image pattern onto a second photoresist layer, developing the second photoresist layer, and etching the material to form the second segment.

The first and second segments can be portions of the material adjacent to trenches in the material corresponding to the first and second image patterns. For instance, the first and second segments can be conductive metal lines, or polysilicon gates for N-channel and P-channel devices, that form a continuous circuit stitched by a portion of the contact region. Alternatively, the first and second segments can be the trenches for providing isolation regions between active device regions in silicon.

Preferably, the contact region has a generally rectangular shape, a width at least twice as wide as the linewidths of the segments, and a length at least as long each of the linewidths. This allows the contact region to accommodate a significant amount of misalignment between the first and second segments while maintaining sufficiently narrow line spacing.

The first and second image patterns can be provided by projecting radiation through a first reticle in a first position with respect to the substrate, and then projecting radiation through a second reticle in a second position with respect to the substrate, with the second position laterally shifted with respect to the first position. Alternatively, the first and second image patterns can be provided by projecting radiation through a first reticle having a first radiation-transmitting pattern, and then projecting radiation through a second reticle having a second radiation-transmitting pattern that is laterally shifted with respect to the first radiation-transmitting pattern.

These and other aspects of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
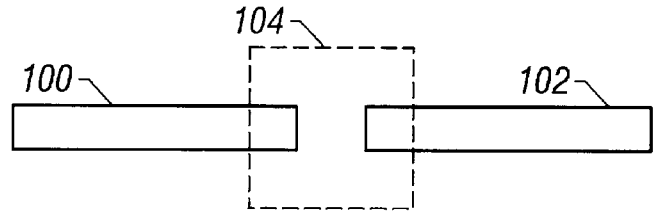
FIGS. 1A–1D show a conventional approach for correcting misalignment between segments defined by adjacent image patterns.
Figure 1B:
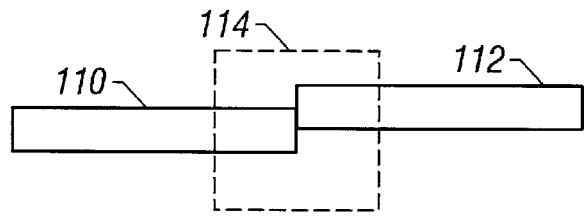
Figure 1C:
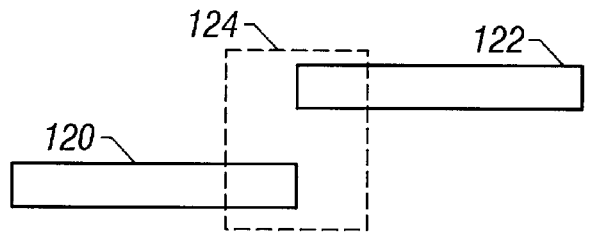
Figure 1D:
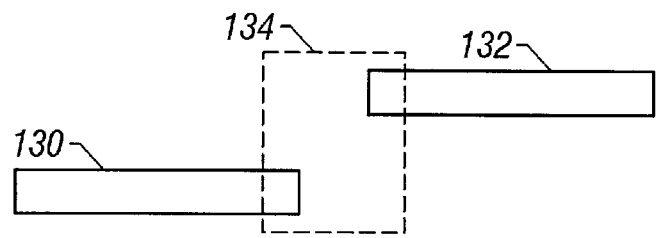

In the drawings, depicted elements are not necessarily drawn to scale and like or similar elements may be designated by the same reference numeral throughout the several views.

FIGS. 2A–2E show top plan views of successive process steps for stitching first and second segments in accordance with an embodiment of the invention, and FIGS. 3A–3E show cross-sectional views of FIGS. 2A–2E, respectively.

Figure 2A:
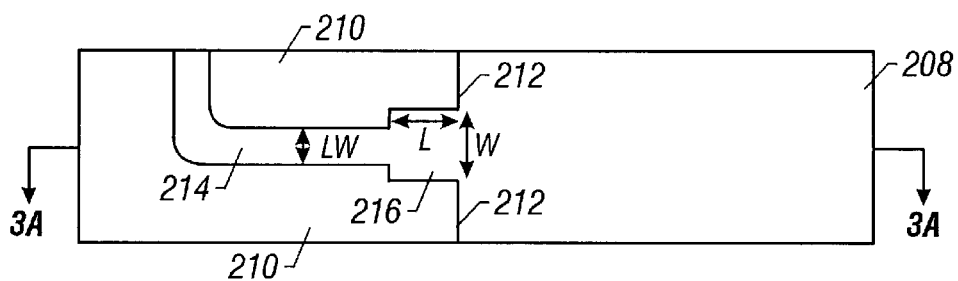
FIGS. 2A–2E show top plan views of successive process steps for stitching first and second segments in accordance with an embodiment of the invention.
Figure 3A:
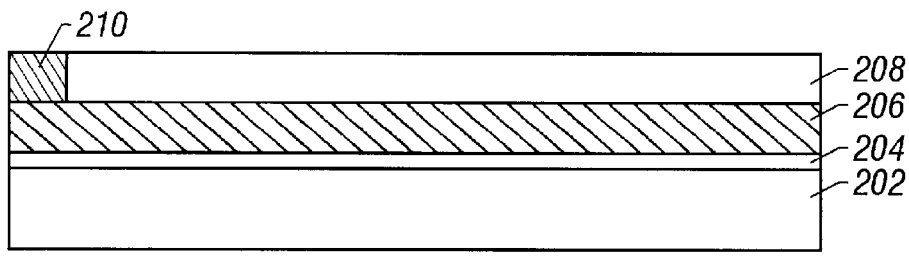
FIGS. 3A–3E show cross-sectional views of FIGS. 2A–2E, respectively.

In FIGS. 2A and 3A, silicon substrate 202 includes a P-type epitaxial surface layer with a <100> orientation and a resistivity of about 12 ohm-cm. Preferably, the epitaxial surface layer is disposed on a P+ base layer (not shown). Substrate 202 is suitable for integrated circuit manufacture. A blanket layer of gate oxide 204, composed of silicon dioxide, is formed on the top surface of substrate 202 using tube growth at a temperature of 700 to 1000° C. in an $O_2$ containing ambient. Gate oxide 204 has a thickness in the range of 30 to 100 angstroms. Thereafter, a blanket layer of undoped polysilicon 206 is deposited by low pressure chemical vapor deposition on the top surface of gate oxide 204. Polysilicon 206 has a thickness of 2000 angstroms. If desired, polysilicon 206 can be doped in situ as deposition occurs, or doped before being etched by implanting arsenic with a dosage in the range of $1\times10^{15}$ to $5\times10^{15}$ atoms/cm$^2$ and an energy in the range of 2 to 80 kiloelectron-volts. However, it is generally preferred that polysilicon 206 be doped later in the process when a dopant is introduced into substrate 202.

Photoresist layer 208, which is positive-acting, is disposed on polysilicon 206. Photoresist layer 208 is deposited as a continuous layer and selectively irradiated using a photolithographic system, such as a step and repeat optical projection system, in which deep ultraviolet light from a mercury-vapor lamp is projected through a reticle and a focusing lens to obtain first image pattern 210 on photoresist layer 208. First image pattern 210 has an outer border 212, beyond which it does not extend. First image pattern 210 defines first segment 214 and contact region 216 between the irradiated regions. First segment 214 is spaced from outer border 212, and contact region 216 is between and adjacent to first segment 214 and outer border 212. First segment 214 has a linewidth (LW) of 3500 angstroms. Contact region 216 has a width (W) of 5500 angstroms, and a length (L) of 2000 angstroms. First segment 214 is centered in the y-direction with respect to contact region 216. Thus, contact region 216 protrudes 1000 angstroms beyond each adjoining sidewall of first segment 214.

Figure 2B:
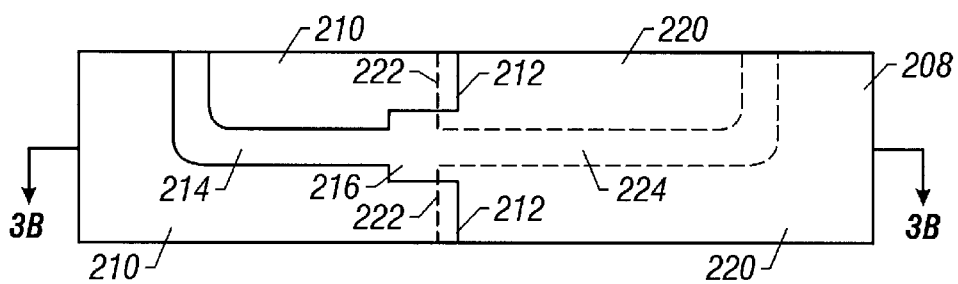
Figure 3B:
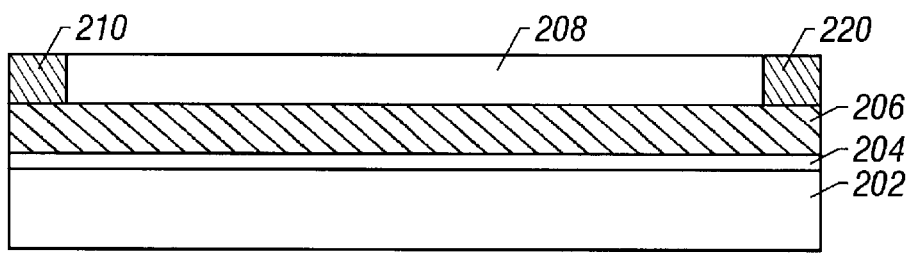

In FIGS. 2B and 3B, photoresist layer 208 is selectively irradiated again using the step and repeat system, and second image pattern 220 (shown as broken lines) is projected onto photoresist 208. Second image pattern 220 has an outer border 222, beyond which it does not extend. Second image pattern 220 defines second segment 224 between the irradiated regions. An end of second segment 224 is adjacent to outer border 222. Second segment 224 has a linewidth of 3500 angstroms. Borders 212 and 222 are parallel to one another and spaced from one another by 500 angstroms in the x-direction. Thus, image patterns 210 and 220 partially overlap between borders 212 and 222. Moreover, segments 214 and 224 are misaligned with respect to one another in both the x- and y-directions. Segments 214 and 224 are displaced in the x- direction by 1500 angstroms, and displaced in the y-direction by 500 angstroms. Accordingly, second segment 224 extends 500 angstroms in the x-direction into contact region 216, is spaced from the upper edge of contact region 216 by 500 angstroms, and is spaced from the lower edge of contact region 216 by 1500 angstroms. Of importance, the entire end of second segment 224 overlaps contact region 216. Thus, contact region 216 accommodates the misalignment between segments 214 and 224, and assures that the stitching between segments 214 and 224 has a linewidth of at least 3500 angstroms.

Second image pattern 220 is superimposed on first image pattern 210 (or the region of photoresist layer 208 irradiated by first image pattern 210) for the sake of comparison. However, it is critical to note that image patterns 210 and 220 are projected using separate exposure steps. That is, first image pattern 210 is projected onto photoresist layer 208, the exposure is discontinued, and then second image pattern 220 is projected onto photoresist layer 208. Therefore, although image patterns 210 and 220 partially overlap, image patterns 210 and 220 are not simultaneously projected onto photoresist layer 208.

Figure 2C:
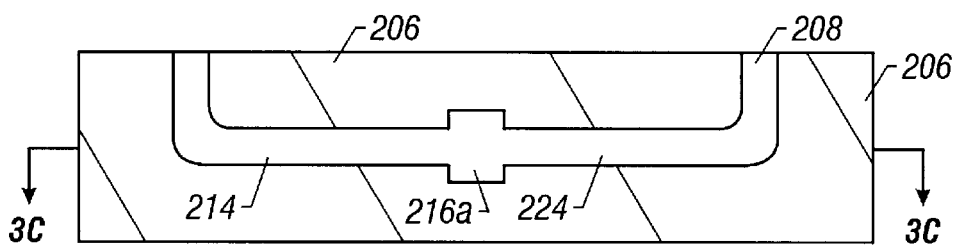
Figure 3C:
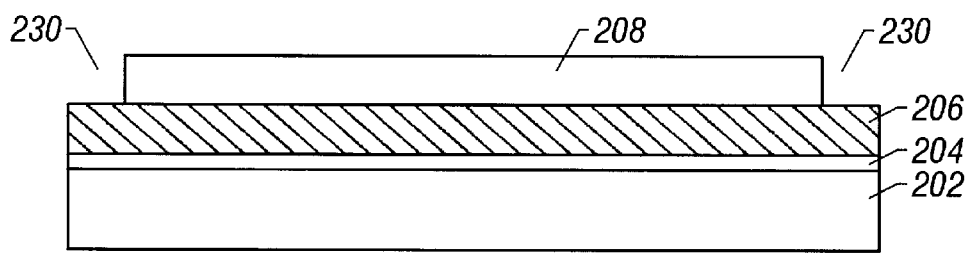

In FIGS. 2C and 3C, photoresist layer 208 is developed. Since photoresist layer 208 is positive-acting, the portions of photoresist layer 208 irradiated by image pattern 210, image pattern 220, or both are removed. As a result, photoresist layer 208 contains openings 230 that selectively expose a portion of polysilicon 206 corresponding to first image pattern 210 and second image pattern 220. The remaining photoresist layer 208 covers first segment 214, second segment 224, and portion 216a of contact region 216. Portion 216a of contact region 216 is outside border 222. The other portion of contact region 216 inside border 222 corresponds to (or is converted into) the end of second segment 224 where it overlaps contact region 216.

Figure 2D:
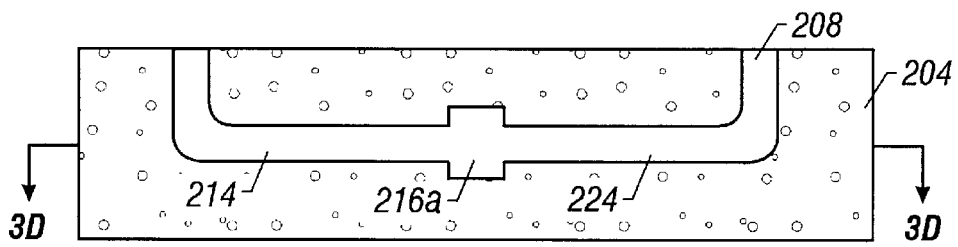
Figure 3D:
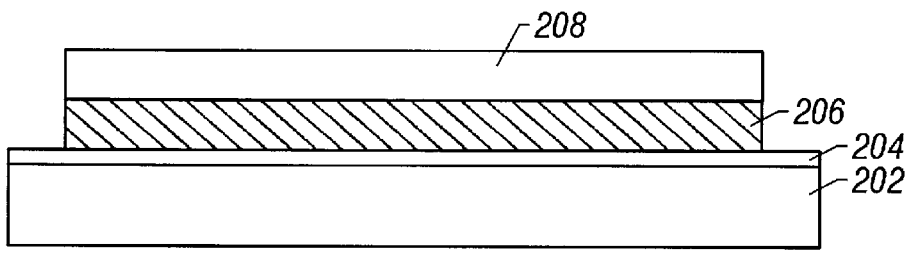

In FIGS. 2D and 3D, an anisotropic dry etch is applied through openings 230 that is highly selective of polysilicon 206. Photoresist layer 208 protects the underlying polysilicon 206 from the etch, however the exposed portion of polysilicon 206 is etched and removed. The etch is highly selective of polysilicon compared to silicon dioxide, so only a negligible amount of gate oxide 204 beneath the exposed portion of polysilicon 206 is removed and substrate 202 is unaffected.

Figure 2E:
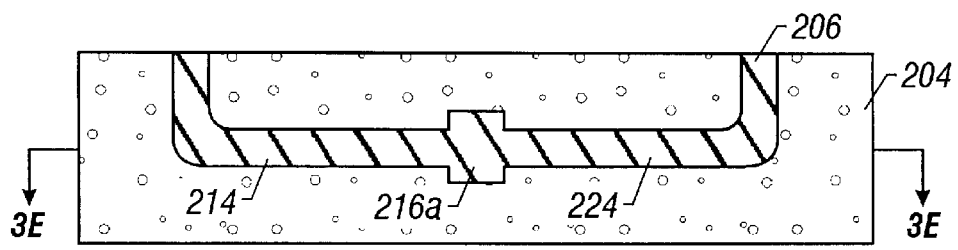
Figure 3E:
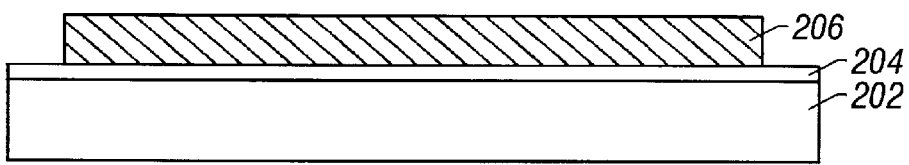

In FIGS. 2E and 3E, photoresist layer 208 is stripped. As is seen, segments 214 and 224 are stitched by portion 216a of contact region 216 to form a continuous circuit with a minimum linewidth of 3500 angstroms despite the misalignment between segments 214 and 224.

FIGS. 4A–4E show top plan views of successive process steps for stitching first and second segments in accordance with a another embodiment of the invention, and FIGS. 5A–5E show cross-sectional views of FIGS. 4A–4E, respectively. This embodiment is similar to the embodiment of FIGS. 2A–2E and 3A–3E, except that the first image pattern is provided after the second image pattern.

Figure 4A:
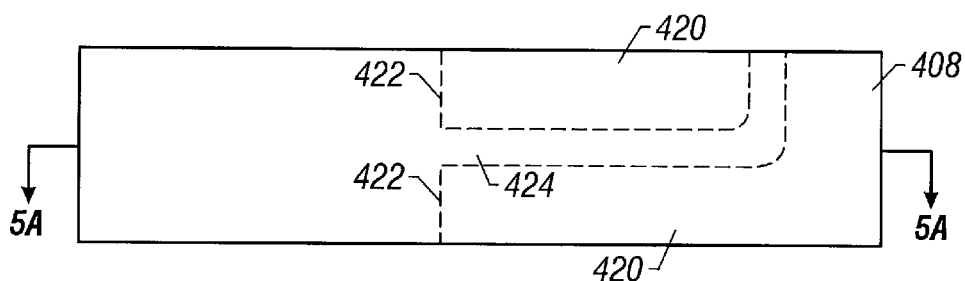
FIGS. 4A–4E show top plan views of successive process steps for stitching first and second segments in accordance with another embodiment of the invention.
Figure 5A:
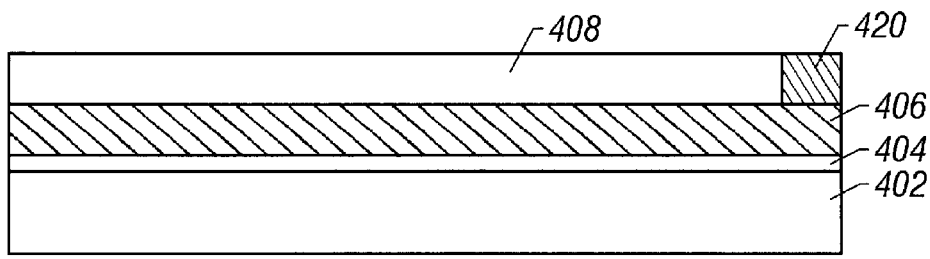
FIGS. 5A–5E show cross-sectional views of FIGS. 4A–4E, respectively.

In FIGS. 4A and 5A, silicon substrate 402 is provided. Gate oxide 404 is formed on substrate 402, and polysilicon 406 is formed on gate oxide 404. Thereafter, photoresist layer 408, which is positive-acting, is deposited on polysilicon 406. Second image pattern 420 is projected onto photoresist layer 408. Second image pattern 420 has outer border 422, and defines second segment 424 with an end adjacent to outer border 422.

Figure 4B:
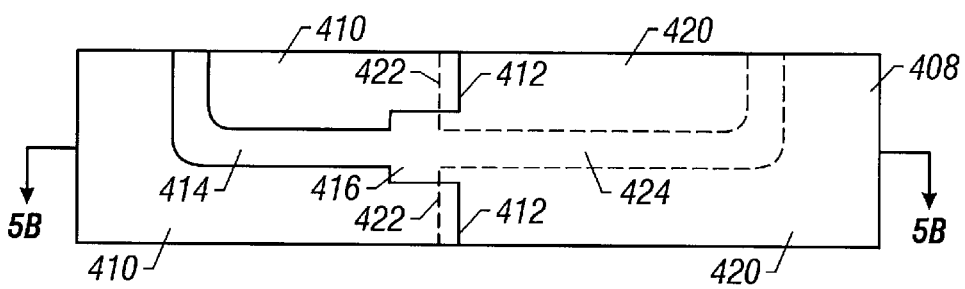
Figure 5B:
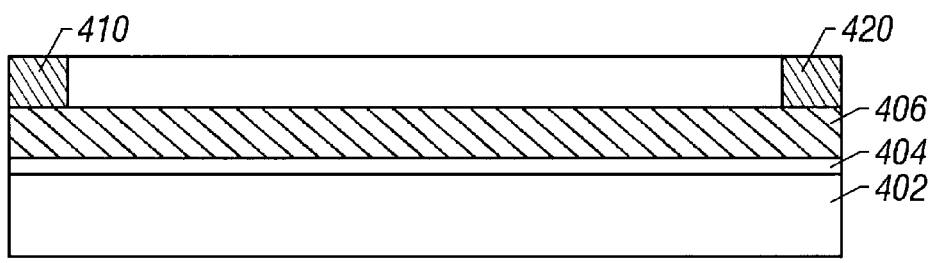

In FIGS. 4B and 5B, photoresist layer 408 is selectively irradiated again using the step and repeat system, and first image pattern 410 is projected onto photoresist 408. First image pattern 410 has an outer border 412, and defines first segment 414 and contact region 416. First segment 414 is spaced from outer border 412, and contact region 416 is between and adjacent to outer border 412 and first segment 414. Borders 412 and 422 are parallel to one another and spaced from one another, and image patterns 410 and 420 partially overlap between borders 412 and 422. Segments 414 and 424 are misaligned with respect to one another in both the x- and y-directions, however the entire end of second segment 424 overlaps contact region 416. Thus, contact region 416 accommodates the misalignment between segments 414 and 424 and maintains the minimum linewidth.

Figure 4C:
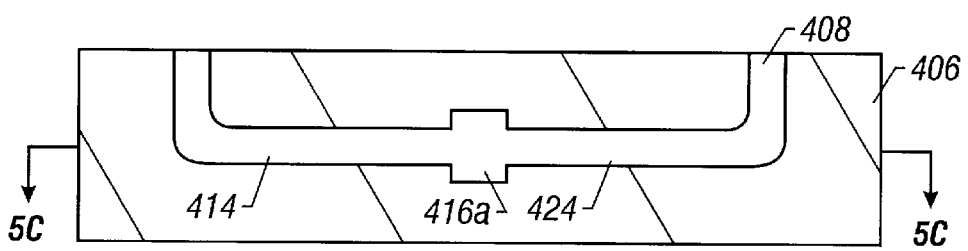
Figure 5C:
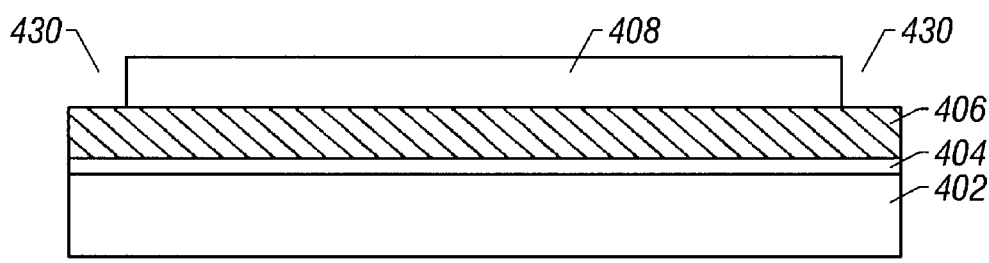

In FIGS. 4C and 5C, photoresist layer 408 is developed. Since photoresist layer 408 is positive-acting, the portions of photoresist layer 408 irradiated by first image pattern 410, second image pattern 420, or both are removed. As a result, photoresist layer 408 contains openings 430 that selectively expose a portion of polysilicon 406 corresponding to first image pattern 410 and second image pattern 420. The remaining photoresist layer 408 covers first segment 414, second segment 424, and portion 416a of contact region 416. Portion 416a of contact region 416 is outside border 422, and the other portion of contact region 416 inside border 422 corresponds to (or is converted into) the end of second segment 424 where it overlaps contact region 416.

Figure 4D:
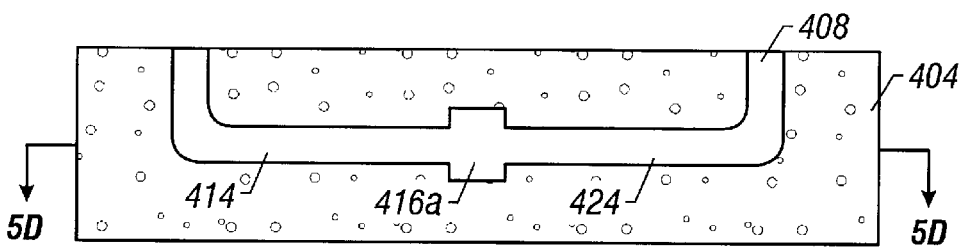
Figure 5D:
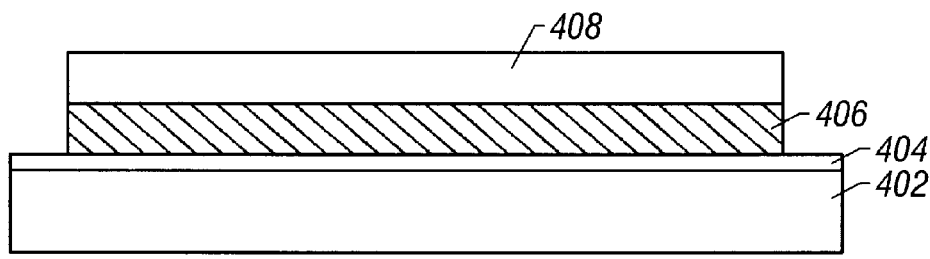

In FIGS. 4D and 5D, an anisotropic dry etch is applied through openings 430 that is highly selective of polysilicon 406. Photoresist layer 408 protects the underlying polysilicon 406 from the etch, however the exposed portion of polysilicon 406 is etched and removed.

Figure 4E:
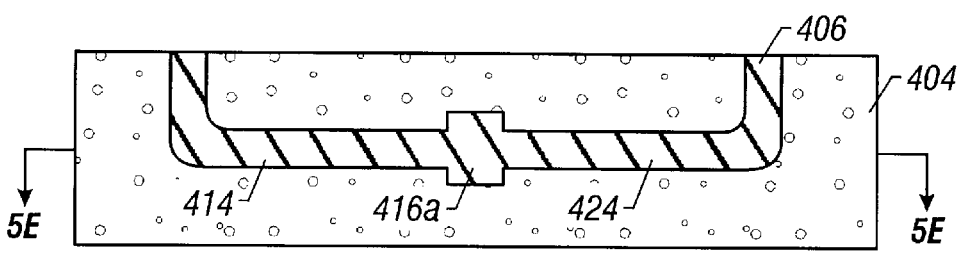
Figure 5E:
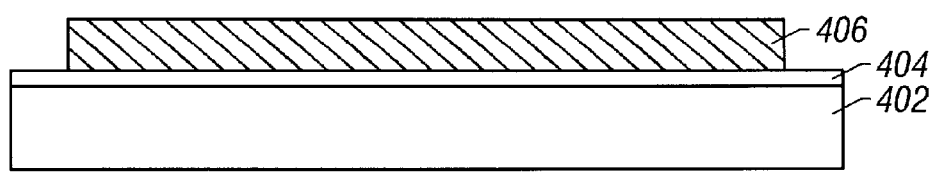

In FIGS. 4E and 5E, photoresist layer 408 is stripped. As is seen, segments 414 and 424 are stitched by portion 416a of contact region 416 to form a continuous circuit that maintains the minimum linewidth despite the misalignment between segments 414 and 424.

FIGS. 6A–6G show top plan views of successive process steps for stitching first and second segments in accordance with a another embodiment of the invention, and FIGS. 7A–7G show cross-sectional views of FIGS. 6A–6G, respectively. This embodiment is similar to the embodiment of FIGS. 2A–2E and 3A–3E, except that first and second segments are formed in sequence, using two photoresist layers, instead of being formed simultaneously using a single photoresist layer.

Figure 6A:
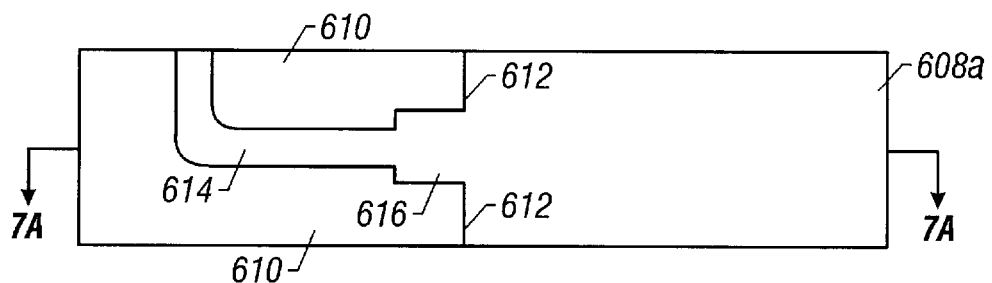
FIGS. 6A–6G show top plan views of successive process steps for stitching first and second segments in accordance with another embodiment of the invention.
Figure 7A:
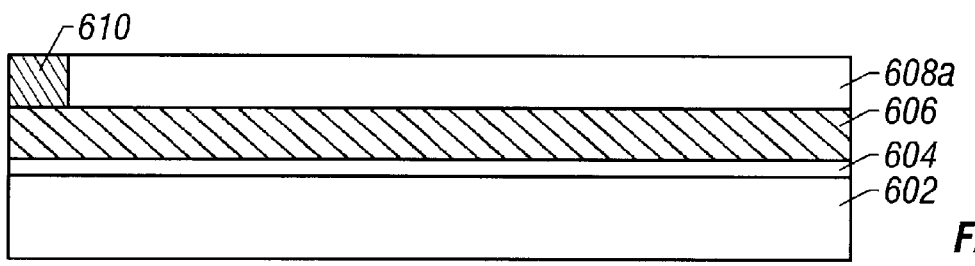
FIGS. 7A–7G show cross-sectional views of FIGS. 6A–6G, respectively.

In FIGS. 6A and 7A, silicon substrate 602 is provided. Gate oxide 604 is formed on substrate 602, and polysilicon 606 is formed on gate oxide 604. Thereafter, first photoresist layer 608a, which is positive-acting, is deposited on polysilicon 606. First image pattern 610 is projected onto first photoresist layer 608a. First image pattern 610 has an outer border 612, and defines first segment 614 spaced from outer border 612 and contact region 616 between and adjacent to outer border 612 and first segment 614.

Figure 6B:
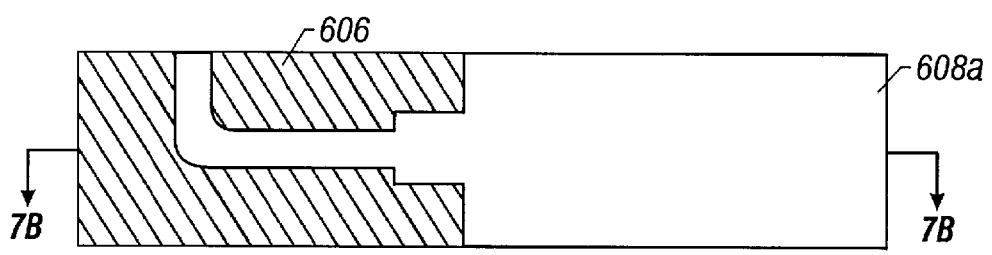
Figure 7B:
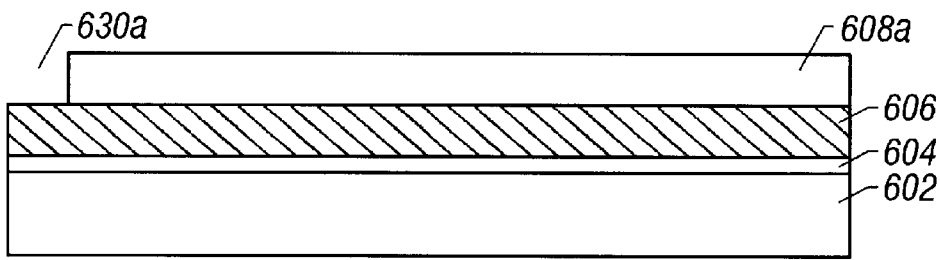

In FIGS. 6B and 7B, first photoresist layer 608a is developed. As a result, first photoresist layer 608a contains openings 630a that selectively expose a portion of polysilicon 606 corresponding to first image pattern 610. The remaining first photoresist layer 608a covers first segment 614, contact region 616, and all polysilicon 606 outside border 612.

Figure 6C:
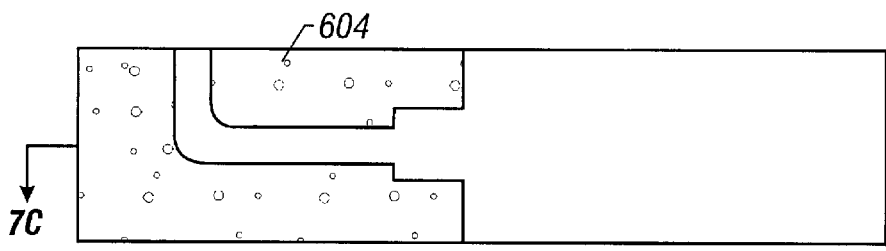
Figure 7C:
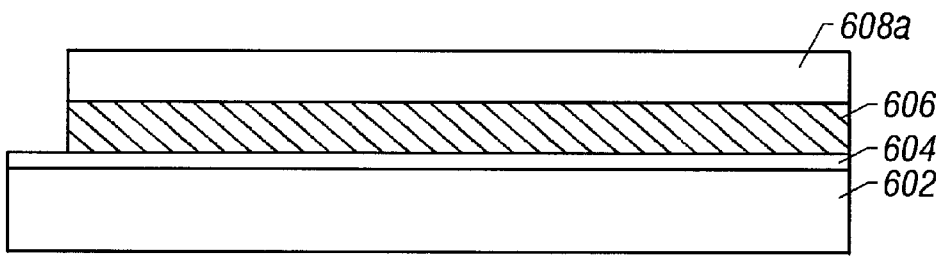

In FIGS. 6C and 7C, an anisotropic dry etch is applied through openings 630a that is highly selective of polysilicon 606. First photoresist layer 608a protects the underlying polysilicon 606 from the etch, however the exposed portion of polysilicon 606 is etched and removed.

Figure 6D:
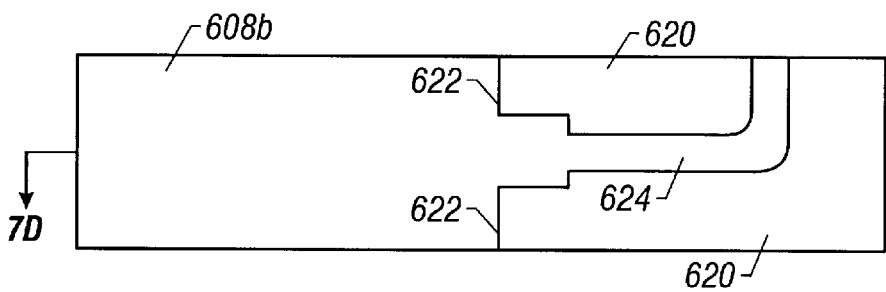
Figure 7D:
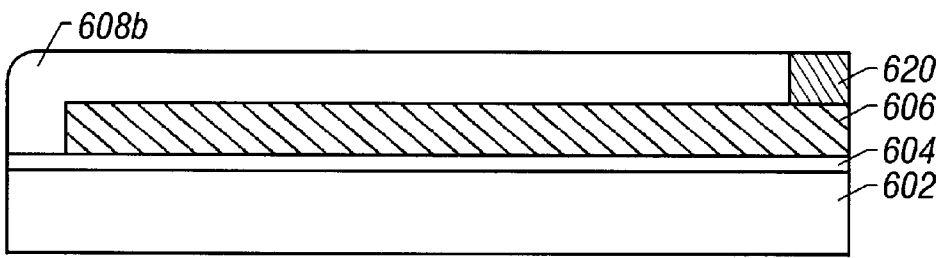

In FIGS. 6D and 7D, first photoresist layer 608a is stripped, and second photoresist layer 608b, which is positive-acting, is deposited over substrate 602. Second photoresist layer 608b is selectively irradiated using the step and repeat system, and second image pattern 620 is projected onto second photoresist layer 608b. Second image pattern 620 has an outer border 622, and defines second segment 624 with an end adjacent to outer border 622.

Figure 6E:
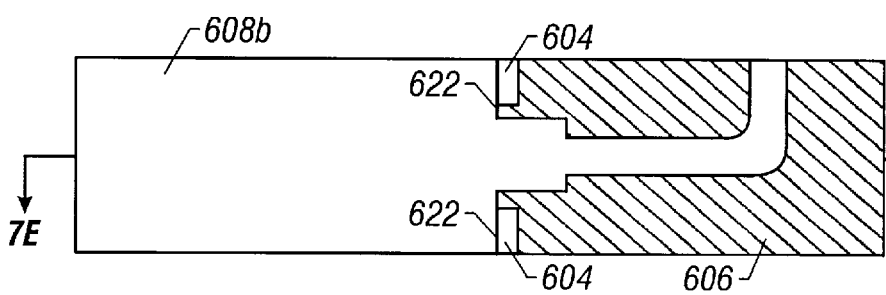
Figure 7E:
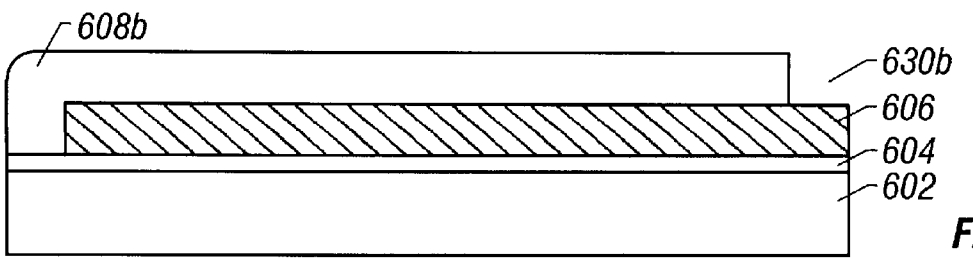

In FIGS. 6E and 7E, second photoresist layer 608b is developed. Since second photoresist layer 608b is positive-acting, the portions of second photoresist layer 608b irradiated by second image pattern 620 are removed. The remaining second photoresist layer 608b contains openings 630b that selectively expose a portion of polysilicon 606 corresponding to second image pattern 620, and covers all polysilicon 606 outside border 622. Openings 630b also expose regions of gate oxide 604 beneath first image pattern 610 inside border 622.

Figure 6F:
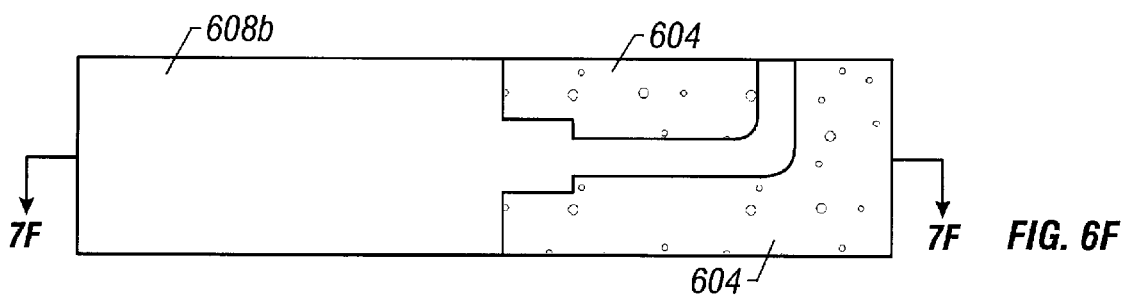
Figure 7F:
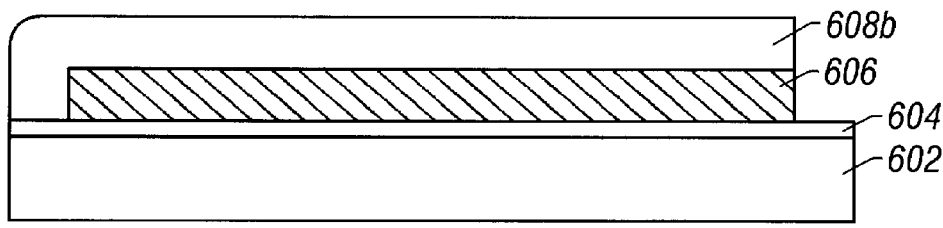

In FIGS. 6F and 7F, an anisotropic dry etch is applied through openings 630b that is highly selective of polysilicon 606. Second photoresist layer 608b protects the underlying polysilicon 606 from the etch, however the exposed portion of polysilicon 606 is etched and removed.

Figure 6G:
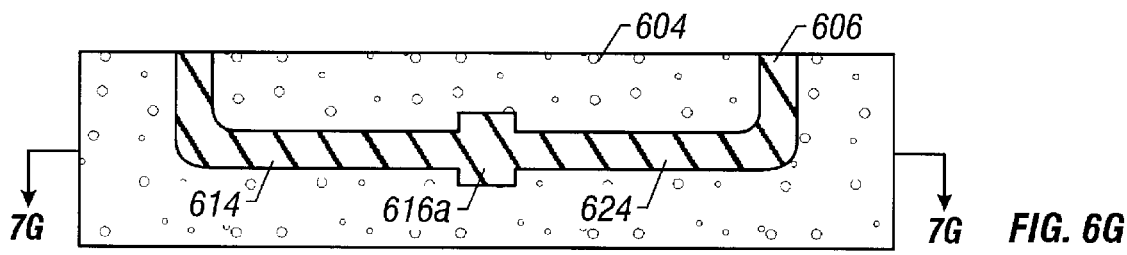
Figure 7G:
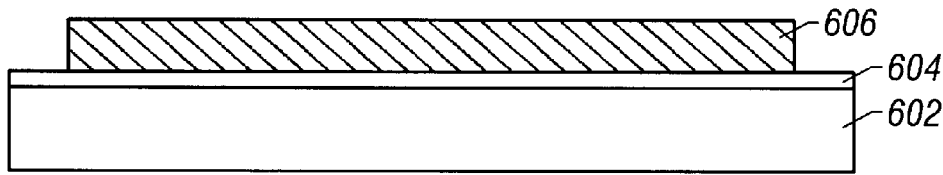

In FIGS. 6G and 7G, second photoresist layer 608b is stripped. As is seen, segments 614 and 624 are stitched by portion 616a of contact region 616 to form a continuous circuit which maintains the minimum linewidth despite the misalignment between segments 614 and 624.

FIGS. 8A–8E show top plan views of successive process steps for stitching first and second segments in accordance with a another embodiment of the invention, and FIGS. 9A–9E show cross-sectional views of FIGS. 8A–8E, respectively. This embodiment is similar to the embodiment of FIGS. 2A–2E and 3A–3E, except that the segments and the contact region are trenches formed in silicon beneath the image patterns, instead of protruding regions of polysilicon outside the image patterns.

Figure 8A:
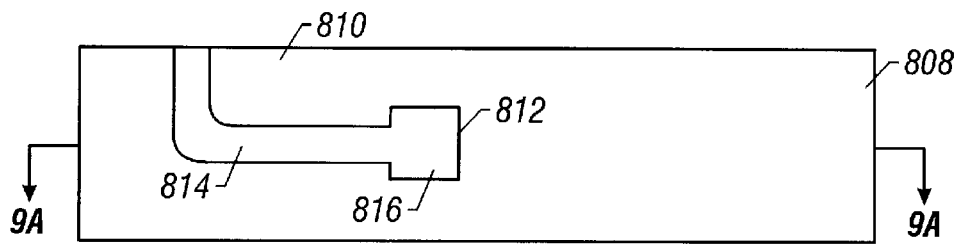
FIGS. 8A–8E show top plan views of successive process steps for stitching first and second segments in accordance with another embodiment of the invention.
Figure 9A:
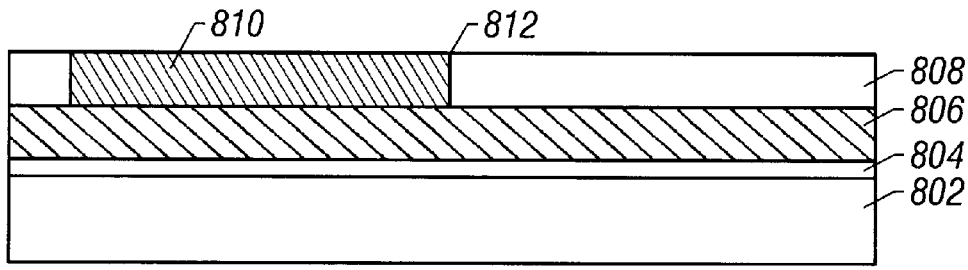
FIGS. 9A–9E show cross-sectional views of FIGS. 8A–8E, respectively.

In FIGS. 8A and 9A, silicon substrate 802 is provided. Oxide 804 is formed on substrate 802 (such as the P+ base without the epitaxial layer), and silicon 806 is formed on oxide 804. Thereafter, photoresist layer 808, which is positive-acting, is deposited on silicon 806. First image pattern 810 is projected onto photoresist layer 808. First image pattern 810 has outer border 812, and defines first segment 814 and contact region 816. First segment 814 is spaced from outer border 812, and contact region 816 is adjacent to and between outer border 812 and first segment 814. First segment 814 and contact region 816 are covered by first image pattern 810.

Figure 8B:
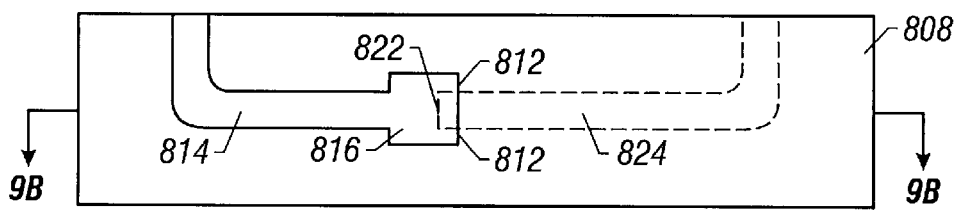
Figure 9B:
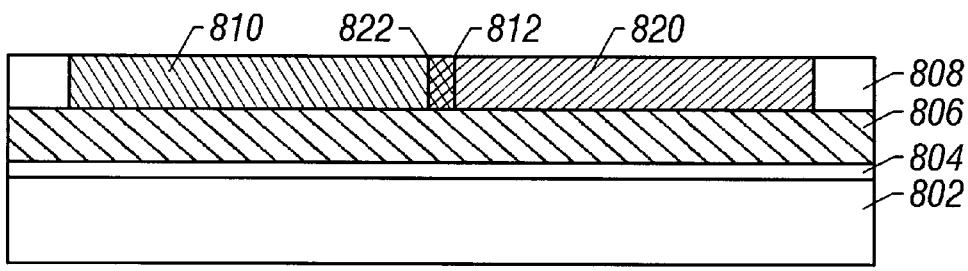

In FIGS. 8B and 9B, photoresist layer 808 is selectively irradiated again using the step and repeat system, and second image pattern 820 is projected onto photoresist 808. Second image pattern 820 has an outer border 822, and defines second segment 824 with an end adjacent to outer border 822. Second segment 824 is covered by second image pattern 820. Borders 812 and 822 are parallel to one another and spaced from one another, and image patterns 810 and 820 partially overlap between borders 812 and 822. Segments 814 and 824 are misaligned with respect to one another in both the x-and y-directions, however the entire end of segment 824 overlaps contact region 816. As a result, contact region 816 accommodates the misalignment and maintains the minimum linewidth.

Figure 8C:
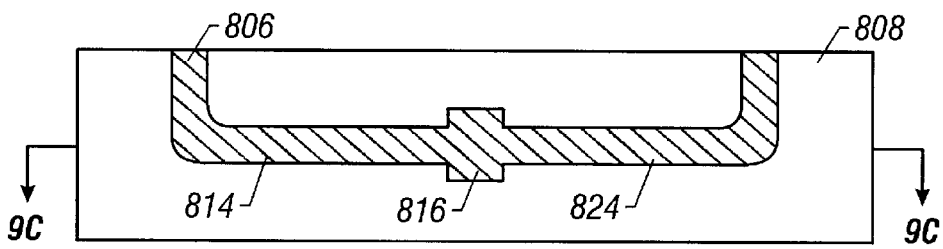
Figure 9C:
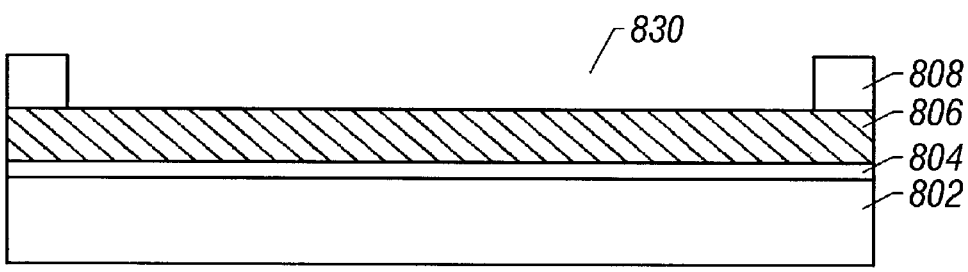

In FIGS. 8C and 9C, photoresist layer 808 is developed. Since photoresist layer 808 is positive-acting, the portions of photoresist layer 808 irradiated by first image pattern 810, second image pattern 820, or both are removed. Thus, photoresist layer 808 contains opening 830 that selectively exposes a portion of silicon 806 corresponding to first image pattern 810 and second image pattern 820. The remaining photoresist layer 808 is outside first segment 814, second segment 824, and contact region 816. Thus, the portion of second segment 824 that overlaps contact region 816 becomes a part of (or is converted into) contact region 816.

Figure 8D:
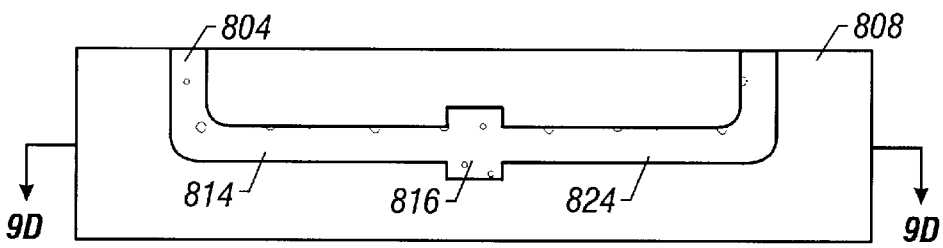
Figure 9D:
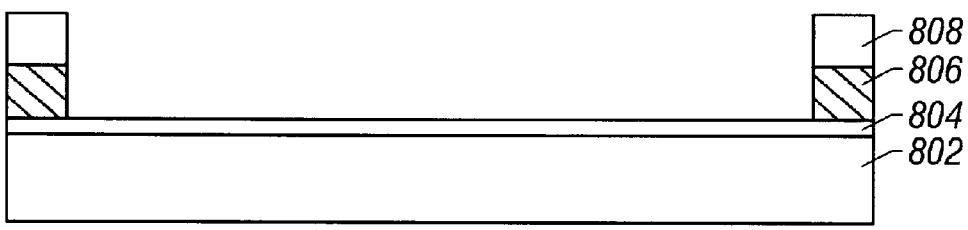

In FIGS. 8D and 9D, an anisotropic dry etch is applied through opening 830 that is highly selective of silicon 806. Photoresist layer 808 protects the underlying silicon 806 from the etch, however the exposed portion of silicon 806 is etched and removed.

Figure 8E:
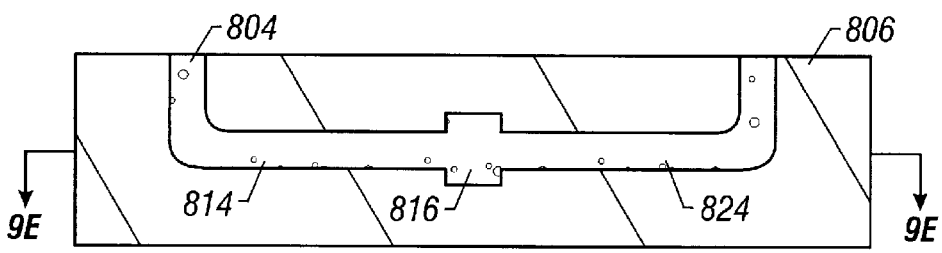
Figure 9E:
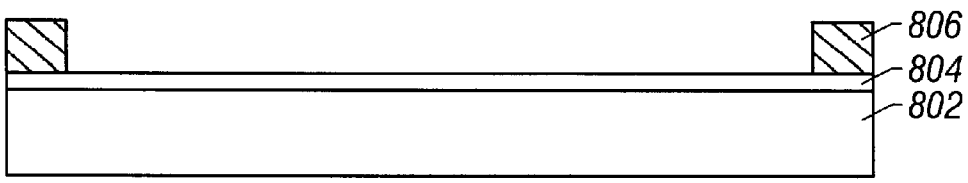

In FIGS. 8E and 9E, photoresist layer 808 is stripped. As is seen, segments 814 and 824 are stitched by contact region 816 to form a continuous trench in silicon 806 which maintains the minimum linewidth despite the misalignment between segments 814 and 824. The trench may be filled, for instance with an oxide to provide local isolation between active device regions in the adjacent silicon 806.

The first and second image patterns can be provided in numerous ways. For instance, the first image can be provided by projecting radiation through a first reticle in a first position with respect to the substrate, and the second image can be provided by projecting radiation through a second reticle in a second position with respect to the substrate, with the second position laterally shifted (or stepped) with respect to the first position in order to laterally shift the second image pattern with respect to the first image pattern. Since the reticle position is shifted, if a repeating image pattern is desired then a single reticle can provide the first and second reticles. Alternatively, the first image pattern can be provided by a first reticle with a first radiation-transmitting pattern in a position with respect to the substrate, and the second image pattern can be provided by a second reticle with a second radiation-transmitting pattern while the second reticle is in the same position. In this instance, the second radiation-transmitting pattern is laterally shifted with respect to the first radiation-transmitting pattern in order to laterally shift the second image pattern with respect to the first image pattern.

The invention is well-suited for stitching together first and second polysilicon gates that control N-channel and P-channel devices. For instance, after the gates are formed, lightly doped N-type source/drain regions are introduced into the substrate by subjecting the structure to ion implantation of arsenic, at a dosage in the range of $1 \times 10^{13}$ to $5 \times 10^{14}$ atoms/cm$^2$ and an energy in the range of 2 to 80 kiloelectron-volts, using the first gate and a photoresist layer that covers the P-channel region as an implant mask, so that the regions are self-aligned to the first gate and doped N– with an arsenic concentration in the range of $1 \times 10^{17}$ to $1 \times 10^{18}$ atoms/cm$^3$ and a junction depth in the range of 100 to 1500 angstroms. Similarly, lightly doped P-type source/drain regions are introduced into the substrate by subjecting the structure to ion implantation of boron, at a dosage in the range of $1 \times 10^{13}$ to $5 \times 10^{14}$ atoms/cm$^2$ and an energy in the range of 2 to 80 kiloelectron-volts, using the second gate and a photoresist layer that covers the N-channel region as an implant mask, so that the regions are self-aligned to the second gate and doped P– with a boron concentration in the range of $1\times10^{17}$ to $1\times10^{18}$ atoms/cm$^3$ and a junction depth in the range of 100 to 1500 angstroms. Thereafter, an oxide layer is conformally deposited over the exposed surfaces by plasma enhanced chemical vapor deposition at a temperature in the range of 300 to 400° C., and the structure is subjected to a reactive ion etch that forms pairs of first and second spacers adjacent to opposing sidewalls of the first and second gates, respectively.

Thereafter, heavily doped N-type source/drain regions are introduced into the substrate by subjecting the structure to ion implantation of arsenic, at a dosage in the range of $1\times10^{15}$ to $1\times10^{15}$ atoms/cm$^2$ and an energy in the range of 2 to 80 kiloelectron-volts, using the first gate and first spacers and a photoresist layer that covers the P-channel region as an implant mask, so that the regions are self-aligned to the first spacers and doped N+ with an arsenic concentration in the range of about $1\times10^{18}$ to $1\times10^{19}$ atoms/cm$^3$ and a junction depth in the range of 200 to 3000 angstroms. Preferably, the junction depth of the heavily doped N-type source/drain regions exceeds that of lightly doped N-type source/drain regions, and the heavy dose of arsenic provides sufficient doping to render the first gate conductive. Likewise, heavily doped P-type source/drain regions are introduced into the substrate by subjecting the structure to ion implantation of boron, at a dosage in the range of $1\times10^{15}$ to $5\times10^{15}$ atoms/cm$^2$ and an energy in the range of 2 to 80 kiloelectron-volts, using the second gate and second spacers and a photoresist layer that covers the N-channel region as an implant mask, so that the regions are self-aligned to the second spacers and doped P+ with a boron concentration in the range of about $1\times10^{18}$ to $1\times10^{19}$ atoms/cm$^3$ and a junction depth in the range of 200 to 3000 angstroms. Preferably, the junction depth of heavily doped P-type source/drain regions exceeds that of lightly doped P-type source/drain regions, and the heavy dose of boron provides sufficient doping to render the second gate conductive. Finally, the structure is annealed to remove crystalline damage and to activate and drive-in the implanted dopants by applying a rapid thermal anneal on the order of 950 to 1050° C. for 10 to 30 seconds.

Further processing steps in the fabrication of N-channel and P-channel devices typically include forming salicide contacts on the gate, source and drain, forming a thick oxide layer over the active regions, forming contact windows in the oxide layer to expose the salicide contacts, forming appropriate interconnect metallization in the contact windows, and forming a passivation layer over the interconnect metallization. In addition, subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps readily apparent to those skilled in the art.

The present invention includes numerous variations to the embodiments described above. For instance, segments to be stitched can be various conductors such as polysilicon, conductive metals, conductive metal silicides, and polycides. Suitable conductive metals include aluminum, cobalt, copper, tungsten, and titanium, as well as oxides and nitrides thereof The contact region can assume various shapes and configurations. Preferably, the width of the contact region is between 50 and 100 percent wider than each of the linewidths of the segments, and the length of the contact region is between 50 and 100 percent of each of the linewidths, in order to accommodate significant misalignment between the segments without unduly increasing line spacing. If desired, the width and length of the contact region can be based upon known misalignments of the step and repeat system. At least a portion of the end of the second segment should overlap the contact region.

The invention is particularly well-suited for stitching polysilicon gates of N-channel MOSFETs, P-channel MOSFETs, and other types of transistors, as well as metal interconnect lines, isolation trenches in semiconductor substrates, and other elements used in semiconductor manufacturing, particularly for high-performance microprocessors where high circuit density is essential. Although only a small region of a semiconductor substrate has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of stitching segments defined by adjacent image patterns of a photolithographic system during the manufacture of a semiconductor device, comprising:

forming a material over a semiconductor substrate;

projecting a first image pattern over the substrate that defines a first segment with a first linewidth and a contact region, wherein the first image pattern has a first image pattern outer border, the first segment is spaced from the first image pattern outer border, the contact region is adjacent to and between the first segment and the first image pattern outer border, and a width of the contact region exceeds the first linewidth;

projecting a second image pattern over the substrate that defines a second segment with a second linewidth, wherein the second image pattern has a second image pattern outer border, the second image pattern outer border forming an end of the second segment, the width of said contact region exceeds the second linewidth, the first and second image patterns partially overlap between the first image pattern outer border and the second image pattern outer border, and at least a portion of the end of the second segment overlaps said contact region; and removing a portion of the material corresponding to the first and second image patterns to form the first and second segments stitched by a portion of said contact region.

2. The method of claim 1, including projecting the first image pattern before projecting the second image pattern.

3. The method of claim 1, including projecting the first image pattern after projecting the second image pattern.

4. The method of claim 1, wherein the first and second segments are formed simultaneously.

5. The method of claim 4, including:
projecting the first image pattern onto a photoresist layer over the material;
projecting the second image pattern onto the photoresist layer;
developing the photoresist layer to selectively expose the material through openings in the photoresist layer corresponding to the first and second image patterns; and
etching the material through the openings in the photoresist layer to simultaneously form the first and second segments and the portion of the contact region.

6. The method of claim 1, wherein the first and second segments are formed in sequence.

7. The method of claim 6, including:
projecting the first image pattern onto a first photoresist layer over the material;
developing the first photoresist layer to selectively expose the material through openings in the first photoresist layer corresponding to the first image pattern;
etching the material through the openings in the first photoresist layer to form the first segment;
projecting the second image pattern onto a second photoresist layer over the material;
developing the second photoresist layer to selectively expose the material through openings in the second photoresist layer corresponding to the second image pattern; and
etching the material through the openings in the second photoresist layer to form the second segment.

8. The method of claim 1, wherein the first and second segments are regions of the material, and removing the portion of the material forms trenches in the material adjacent to the first and second segments.

9. The method of claim 8, wherein the first and second segments and the portion of the contact region form a continuous circuit.

10. The method of claim 8, wherein the material is a conductor selected from the group consisting of polysilicon, conductive metals, conductive metal silicides, and polycides.

11. The method of claim 10, wherein the conductive metals are selected from the group consisting of aluminum, cobalt, copper, tungsten, and titanium, as well as oxides and nitrides thereof.

12. The method of claim 1, wherein the first and second segments are trenches in the material, and removing the portion of the material forms the trenches.

13. The method of claim 11, wherein the first and second segments are isolation trenches adjacent to active device regions in the material which is silicon.

14. The method of claim 1, wherein the end of the second segment lies within the contact region.

15. The method of claim 1, wherein the width of the contact region is at least 50 percent larger than each of the first and second linewidths.

16. The method of claim 15, wherein a length of the contact region between the first segment and the first outer border is at least 50 percent of each of the first and second linewidths.

17. The method of claim 15, wherein the contact region has a rectangular shape.

18. The method of claim 1, wherein the first and second segments provide polysilicon gates for N-channel and P-channel devices.

19. A method of stitching segments defined by adjacent image patterns of a photolithographic system to form a continuous circuit during the manufacture of a semiconductor device, comprising:
forming a material over a semiconductor substrate;
forming a photoresist layer over the material;
projecting a first image pattern onto the photoresist layer during a first exposure step to define a first segment of the material and a contact region of the material, wherein the first image pattern has a first image pattern outer border, and the first segment has a first linewidth and is spaced from the first image pattern outer border, the contact region is between and adjacent to the first segment and the first outer border, and a width of the contact region exceeds the first linewidth;
projecting a second image pattern onto the photoresist layer during a second exposure step to define a second segment of the material, wherein the second image pattern has a second image pattern outer border, an end of the second segment is adjacent to the second image pattern outer border, the first image pattern outer border and the second image pattern outer border are parallel to and spaced from one another, the first and second image patterns partially overlap between the first image pattern outer border and the second image pattern outer border, the end of the second segment is entirely within said contact region, and the width of said contact region exceeds the second linewidth;
removing portions of the photoresist layer beneath the first and second image patterns to selectively expose the material through openings in the photoresist layer; and
etching the material through the openings in the photoresist layer to simultaneously form the first and second segments as a continuous circuit stitched together by a portion of said contact region.

20. The method of claim 19, including projecting the first image pattern onto the photoresist layer before projecting the second image pattern onto the photoresist layer.

21. The method of claim 19, wherein:
projecting the first image pattern onto the photoresist layer includes projecting radiation through a first reticle in a first position with respect to the substrate; and
projecting the second image pattern onto the photoresist layer includes projecting radiation through a second reticle in a second position with respect to the substrate, and the second position is laterally shifted with respect to the first position so as to laterally shift the second image pattern with respect to the first image pattern.

22. The method of claim 19, wherein:
projecting the first image pattern onto the photoresist layer includes projecting radiation through a first reticle having a first radiation-transmitting pattern while the first reticle has a position with respect to the substrate; and
projecting the second image pattern onto the photoresist layer includes projecting radiation through a second reticle having a second radiation-transmitting pattern while the second reticle has the position with respect to the substrate, wherein the second radiation-transmitting pattern is laterally shifted with respect to the first radiation-transmitting pattern so as to laterally shift the second image pattern with respect to the first image pattern.

23. The method of claim 19, wherein the material is polysilicon and the first and second segments provide first and second polysilicon gates for N-channel and P-channel devices.

24. The method of claim 19, wherein the contact region has a rectangular shape.

25. The method of claim 24, wherein the width of the contact region is between 50 and 100 percent larger than each of the first and second linewidths.

26. The method of claim 24, wherein the contact region has a length between 50 and 100 percent of each of the first and second linewidths.

27. The method of claim 24, wherein the first and second linewidths are identical.

28. A method of stitching polysilicon gates formed by adjacent image patterns of a photolithographic system during the manufacture of N-channel and P-channel devices, comprising in the sequence set forth:

forming a gate oxide over a semiconductor substrate;

forming a polysilicon layer over the gate oxide;

forming a photoresist layer over the polysilicon;

projecting a first image pattern onto the photoresist layer during a first exposure step to define a first gate of the polysilicon layer and a rectangularly-shaped contact region of the polysilicon layer, wherein the first image pattern has a first image pattern outer border, the first gate has a first linewidth and is spaced from the first image pattern outer border, the contact region is between and adjacent to the first gate and the first image pattern outer border, and a width of the contact region is at least 50 percent larger than the first linewidth;

projecting a second image pattern onto the photoresist layer during a second exposure step to define a second gate of the polysilicon layer, wherein the second image pattern has a second image pattern outer border, an end of the second gate is adjacent to the second image pattern outer border, the first image pattern outer border and the second image pattern outer border are parallel to and spaced from one another, the first and second image patterns partially overlap between the first image pattern outer border and the second image pattern outer border, the end of the second gate is entirely within said contact region, the first and second linewidths are similar to one another, and the width of said contact region is at least 50 percent larger than the second linewidth;

removing portions of the photoresist layer beneath the first and second image patterns to selectively expose the polysilicon layer through openings in the photoresist layer; and etching the polysilicon layer through the openings in the photoresist layer to simultaneously form the first and second gates as a continuous circuit stitched together by a portion of said contact region.

* * * * *